United States Patent [19]

Tran

[11] Patent Number: 4,831,596
[45] Date of Patent: May 16, 1989

[54] PASS GATE WITH LOW TRANSISTOR JUNCTION BREAKDOWN SUSCEPTIBILITY

[75] Inventor: Hiep V. Tran, Carrollton, Tex.

[73] Assignee: Texas Instruments Incorporated, Dallas, Tex.

[21] Appl. No.: 45,914

[22] Filed: May 1, 1987

[51] Int. Cl.$^4$ .................. G11C 7/00; H03K 17/687
[52] U.S. Cl. .................. 365/230.06; 307/578; 365/203; 365/182
[58] Field of Search .............. 365/182, 149, 189, 230, 365/233, 203; 307/449, 463, 482, 578, 577

[56] References Cited

U.S. PATENT DOCUMENTS

| | | | |
|---|---|---|---|
| 4,267,464 | 5/1981 | Takomae et al. | 365/230 |
| 4,381,460 | 4/1983 | Menachem | 365/230 |
| 4,508,978 | 4/1985 | Reddy | 307/482 |
| 4,618,786 | 10/1986 | Johnson | 307/482 |
| 4,638,182 | 1/1987 | Mc Adams | 307/578 |

Primary Examiner—Stuart N. Hecker
Assistant Examiner—Glenn A. Gossage
Attorney, Agent, or Firm—Stanton C. Braden; James T. Comfort; Melvin Sharp

[57] ABSTRACT

A pass circuit (54) passes a boot signal through a first transistor (60) when the pass circuit (54) is selected by a select signal (106). A second transistor (100) is precharged prior to receiving the select signal (106). In response to the select signal (106), a high voltage is passed to the first transistor (60) and the voltage at the gate of the second transistor (100) is pulled above a high voltage. After a delay period, another transistor (88) conducts between the gate of the second transistor (100) and $V_{cc}$, to discharge the gate voltage. With both the source and gate of the second transistor (100) at a high voltage, the second transistor (100) is put in a non-conducting state. As the boot signal passes through the first transistor (60), the gate voltage of the first transistor (60) is increased above a high voltage, but the voltage at the gate of the second transistor (100) is maintained at $V_{CC}$, thus preventing junction breakdown.

4 Claims, 2 Drawing Sheets

PASS GATE WITH LOW TRANSISTOR JUNCTION BREAKDOWN SUSCEPTIBILITY

BACKGROUND OF THE INVENTION

Dynamic RAM circuits commonly supply a two-stage "boot" signal to drive their wordlines in order to improve DRAM performance. For example, U.S. Pat. Nos. 4,543,500 and 4,533,843 to McAlexander et al. contain disclosure of the advantages of booting the wordline of a DRAM above the supply voltage. In the first stage of the boot signal, the signal rises from a low voltage (ground) to a high voltage (the power supply voltage or "$V_{cc}$"). In the second stage of the boot signal, the signal is "booted" or "boosted" above $V_{cc}$ in order to fully restore the charge in the DRAM cell which was previously read. As taught by U.S. Pat. Nos. 4,533,843 and 4,543,500, it is necessary to supply a voltage higher than $V_{cc}$ in order to fully charge the memory cell.

The two-stage boot signal is generated by a "booting circuit." The boot signal is output to a plurality of "pass gates", each pass gate being associated with a wordline. A "row decode" circuit selects one of the pass gates to pass the signal to its associated wordline, while the remainder of the pass gates remain in a high impedance state.

In previously developed pass gates, a transistor is used to pass the boot signal. Since the boot signal exceeds $V_{cc}$ in its second stage, the gate of the transistor must likewise exceed $V_{cc}$. The large voltage present at the gate of the transistor results in large voltage differentials across the junctions of other transistors in the circuit, thus creating a potential for field-aided breakdown of those junctions. The possibility of field-aided breakdown of a transistor junction presents a reliability problem, as the characteristics of the affected transistor may change after repeated exposure to junction breakdown conditions.

Therefore, the need has arisen for a pass gate which increases the breakdown voltage limit of a transistor subject to field-aided breakdown.

SUMMARY OF THE INVENTION

The present invention disclosed and claimed herein describes a method and apparatus for passing a boot signal to a wordline of a dynamic memory which substantially eliminates problems associated with prior passing circuits.

In one aspect of the invention, a circuit for passing a boot signal in response to a select signal is disclosed in which a first transistor is operable to pass the boot signal to the wordline. The first transistor is precharged by a second transistor in response to the select signal. Switching circuitry connected to the gate of the second transistor is operable to place the second transistor in a non-conducting mode, while maintaining a logical high voltage at the gate of the second transistor. In doing so, the breakdown voltage limit of the second transistor is increased.

This aspect of the present invention produces the technical advantage of minimizing the possibility of junction breakdown of the transistor by increasing the junction breakdown limit.

BRIEF DESCRIPTION OF THE DRAWINGS

For a more complete understanding of the present invention and the advantage thereof, reference is now made to the following description taken in conjunction with the accompanying drawings in which.

DETAILED DESCRIPTION OF THE INVENTION

The preferred embodiment of the present invention is best understood by referring to FIGS. 1–4 of the drawings, like numerals being used for like and corresponding parts of the various drawings.

Figure 1:
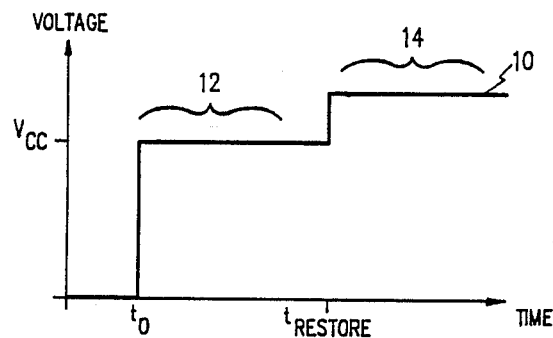
FIG. 1 illustrates a boot signal supplied to the input of the pass gate.

Referring to FIG. 1, a graph of a booting signal 10 used to drive the wordline of a dynamic RAM is illustrated. The booting signal 10 has two stages: a "read" stage 12, and a "boot" stage 14. In the read stage 12, the boot signal 10 undergoes a low to high transition beginning at $t_0$. In the boot stage 14, the boot signal 10 is boosted a prescribed voltage above $V_{cc}$, as is described in U.S. Pat. Nos. 4,533,843 and 4,543,500 which are incorporated by reference herein.

Figure 2:
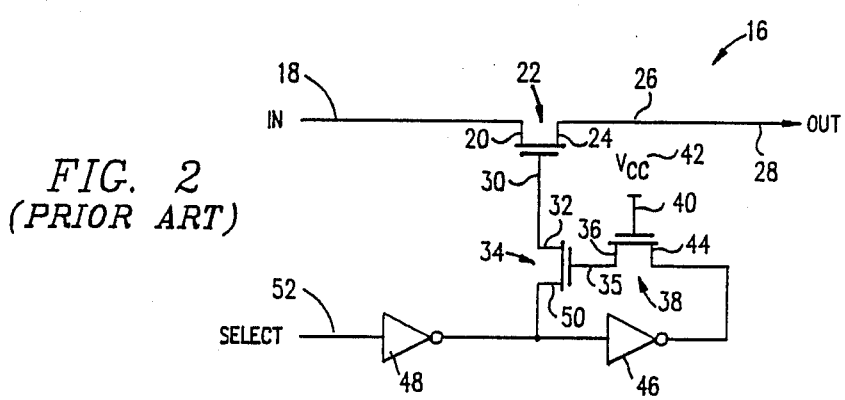
FIG. 2 illustrates a previously developed standard pass gate used to pass the boot signal to an associated wordline.

Referring now to FIG. 2, a prior art pass gate 16 for passing the boot signal 10 to a wordline is illustrated. An input node 18 receives the boot signal 10 from the boot circuitry. The input node 18 is connected to the source 20 of an N-channel transistor 22. The drain 24 of the N-channel transistor 22 is connected to an output node 26, which is connected to a wordline 28. The gate 30 of the N-channel transistor 22 is connected to the drain 32 of an N-channel transistor 34. The gate 35 of the N-channel transistor 34 is connected to the drain 36 of another N-channel transistor 38. The gate 40 of the N-channel transistor 38 is connected to $V_{cc}$ 42. The source 44 of the N-channel transistor 38 is connected to output of an inverter 46. The output of another inverter 48 is connected to the input of inverter 46 and to the source 50 of the N-channel transistor 34. A SELECT signal 52 is connected to the input of inverter 48.

As is known, a N-channel transistor will conduct from its source to its drain if the voltage at its gate exceeds the voltage at its source by a threshold voltage, $V_T$, of approximately 0.7 volts.

The purpose of the prior art pass gate 16 is to pass the boot signal 10 from the input 18 to the output 26 while SELECT 52 is in a low voltage state. In operation, SELECT 52 is connected to addressing logic (see FIG. 4) which enables the SELECT line associated with one of a plurality of pass gates 16. When the SELECT 52 is in a high voltage state, the output of inverter 48 is low, the output of the inverter 46 is high, and hence the gate 35 of the N-channel transistor 34 is high. With the gate 35 high, the N-channel transistor 34 is in a conducting state, and hence the low voltage at the output of the inverter 48 is connected to the gate 30 of the N-channel transistor 22. Since the gate 30 of N-channel transistor 22 is connected to a low voltage, the N-channel transistor 22 maintains a high impedance state and the boot signal cannot pass from input 18 to output 26.

As the SELECT 52 switches from a high voltage state to a low voltage state, the output of the inverter 48 will switch from a low voltage state to a high voltage state. Since the transistor 34 is still in a conducting state, the high voltage passes from the output of the inverter 48 to the gate 30 of the N-channel transistor 22, thus precharging the N-channel transistor 22 in a conducting state. Subsequently, the signal at the output of the inverter 48 will propagate through the inverter 46 and the N-channel transistor 38, driving the gate 35 of the N-channel transistor 34 to a low voltage. With the gate 35 in a low voltage state, the N-channel transistor 34 becomes non-conducting from source 50 to drain 32.

As the boot signal 10 switches from a low voltage state to a high voltage state, the high voltage present at the gate 30 will increase to a voltage above $V_{cc}$, because of the capacitance in the channel between source 20 and gate 30. With the voltage at the gate 30 above $V_{cc}$, the N-channel transistor 22 can conduct from source 20 to drain 24, even when the voltage at the input 18 exceeds $V_{cc}$. Therefore, the N-channel transistor 22 is operable to conduct both stages 12 and 14 of the boot signal 10.

A problem associated with the prior art pass gate 16 is the voltage differential between the drain 22 and the gate 35 of the N-channel transistor 34 during the passing of the boot signal 10. The boot signal 10 may pull the voltage present at the drain 32 of the N-channel transistor 34 above 12 volts. The gate 35 of the N-channel transistor 34, however, remains at a low voltage state, i.e., ground. Thus, the full 12 volts exists across the gate/drain junction of the N-channel transistor 34.

Junction breakdown may occur as a result of a voltage between the drain and the substrate. The voltage necessary to cause junction breakdown will depend upon the particular junction characteristics, such as junction depth. Junction breakdown results in an avalanche to the substrate. Repeated junction breakdown may cause the $V_T$ of the transistor to change, creating a reliability problem. However, the breakdown voltage limit can be increased by increasing the gate voltage. Junction breakdown is described in detail in S.M. Sze, "Physics of Semiconductor Devices," (Wiley—Interscience 1969), which is incorporated by reference herein.

Figure 3A:
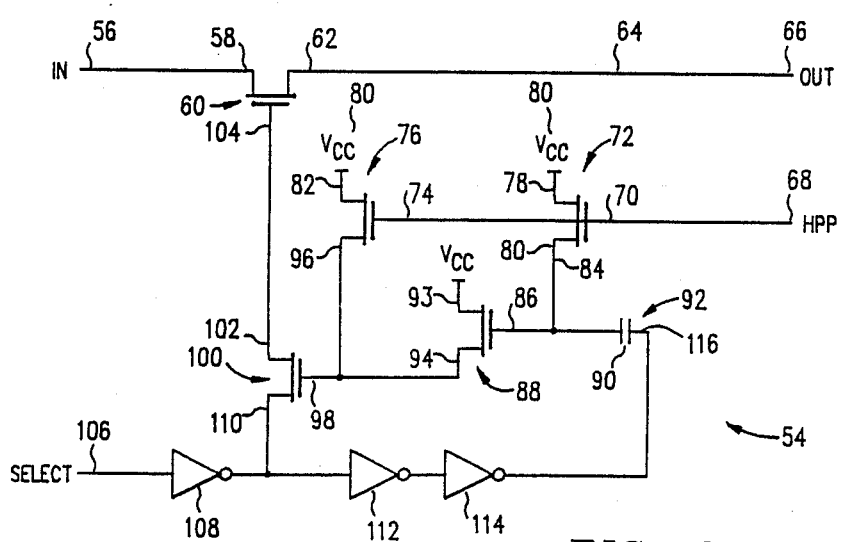
FIG. 3a illustrates the pass gate of the present invention used to pass the booting signal to the wordline.

Referring now to FIG. 3a, the pass circuit 54 of the present invention is illustrated. An input node 56 is connected to the source 58 of an N-channel transistor 60. The drain 62 of the N-channel transistor 60 is connected to the output node 64, which is connected to a wordline 66. A high precharge pulse 68 (hereinafter "HPP" 68) is connected to the gate 70 of an N-channel transistor 72 and a gate 74 of an N-channel transistor 76. The source 78 of the N-channel transistor 72 is connected to $V_{cc}$ 80, as is the source 82 of the N-channel transistor 76. The drain 84 of the N-channel transistor 72 is connected to the gate 86 of an N-channel transistor 88 and to the first plate 90 of a capacitor 92. The source 93 of the N-channel transistor 88 is connected to $V_{cc}$ 80. The drain 94 of the N-channel transistor 88 is connected to the drain 96 of the N-channel transistor 76 and to the gate 98 of an N-channel transistor 100. The drain 102 of the N-channel transistor 100 is connected to the gate 104 of the N-channel transistor 60.

The SELECT signal 106 is connected to the input of an inverter 108. The output of the inverter 108 is connected to the source 100 of the N-channel transistor 100 and to the input of an inverter 112. The output of the inverter 112 is connected to the input of another inverter 114, the output of which is connected to the second plate 116 of the capacitor 92.

Figure 3B:
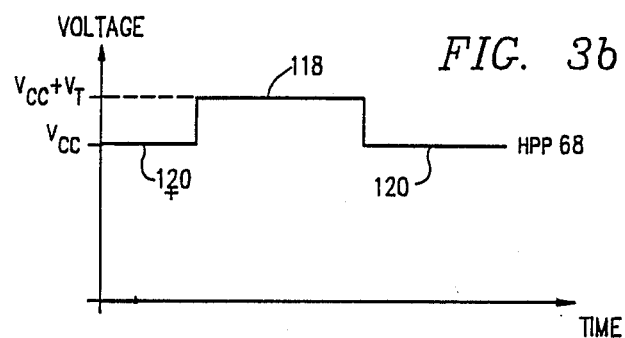
FIG. 3b illustrates a high precharge pulse signal, used to precharge nodes of the pass gate of the present invention.

The HPP signal 68 is illustrated in FIG. 3b. The HPP signal 68 is used to charge certain nodes in the pass circuit of the present invention 54, and comprises a pulse having upper voltage 118 of $V_{cc} + V_t$, where $V_t$ is the threshold voltage of a N-channel transistor. In the illustrated embodiment, the pulse has a lower voltage 120 of $V_{cc}$; however, the lower bounds of the pulse may be set below $V_{cc}$ if desired.

In operation, the HPP signal 68 is pulsed prior to a change in the voltage at the input node 56 or in the SELECT signal 106. As the voltage of the HPP signal 68 reaches its upper voltage 118, the N-channel transistors 76 and 72 are operable to conduct $V_{cc}$ 80 from their respective sources 82 and 78 to their respective drains 96 and 84. Consequently, the gates 98 and 86 of the transistors 100 and 88 are set to $V_{cc}$. As the HPP signal 68 returns to its lower voltage 120, the N-channel transistors 76 and 72 are turned off since the gate voltage does not exceed the source voltage.

As the SELECT signal 106 switches from high to low, the voltage at the source 110 of the N-channel transistor 100 switches from a low voltage state to a high voltage state. Since both the N-channel transistors 76 and 88 are in a non-conducting state with both their sources and gates set to $V_{cc}$, the increase of voltage at the source 110 pulls the voltage at the gate 98 of the N-channel transistor 100 above $V_{cc}$ due to the capacitance between source and gate, as is the voltage at the drain 94 of the N-channel transistor 88. Because the voltage at the gate 98 exceeds the voltage at the source 110, $V_{cc}$ is passed from the source 110 to the gate 104 of the N-channel transistor 60.

As the signal from the output of the inverter 108 propagates through the inverters 112 and 114, the voltage at the second plate 116 of the capacitor 92 is switched from low to high. With the N-channel transistor 72 in a non-conducting state, the rise in voltage at the second plate 116 causes the voltage at the first plate 90 to rise as well. Since the voltage at the first plate 90 was previously at $V_{cc}$, it is booted above $V_{cc}$ in response to the change in voltage at the second plate 116. Consequently, the gate 86 of the N-channel transistor 88 acquires a voltage above $V_{cc}$, and the N-channel transistor 88 is turned on, thus discharging the voltage present at its drain 94 to $V_{cc}$. With the drain 94 at $V_{cc}$ and the gate 98 of the N-channel transistor 100 also at $V_{cc}$, the N-channel transistor 100 assumes a non-conducting state.

At this point, the pass circuit of the present invention 54 is ready to receive the boot signal 10 at it input node 56. As the boot signal rises from a low voltage to a high voltage, the gate 104 of the N-channel transistor 60 is pulled above $V_{cc}$, allowing both stages 12 and 14 of the boot signal to pass from the input 56 to the output 64.

In both the prior art pass gate 16 and the pass circuit 54 of the present invention, the gate of the N-channel transistor passing the boot signal 10 is pulled above $V_{cc}$. However, in the pass circuit of the present invention 54, the gate 98 of the N-channel transistor 100 is set at $V_{cc}$, rather than ground, reducing the possibility of junction breakdown. This results in the technical advantage of increased reliability of the pass circuit 54.

Figure 4:
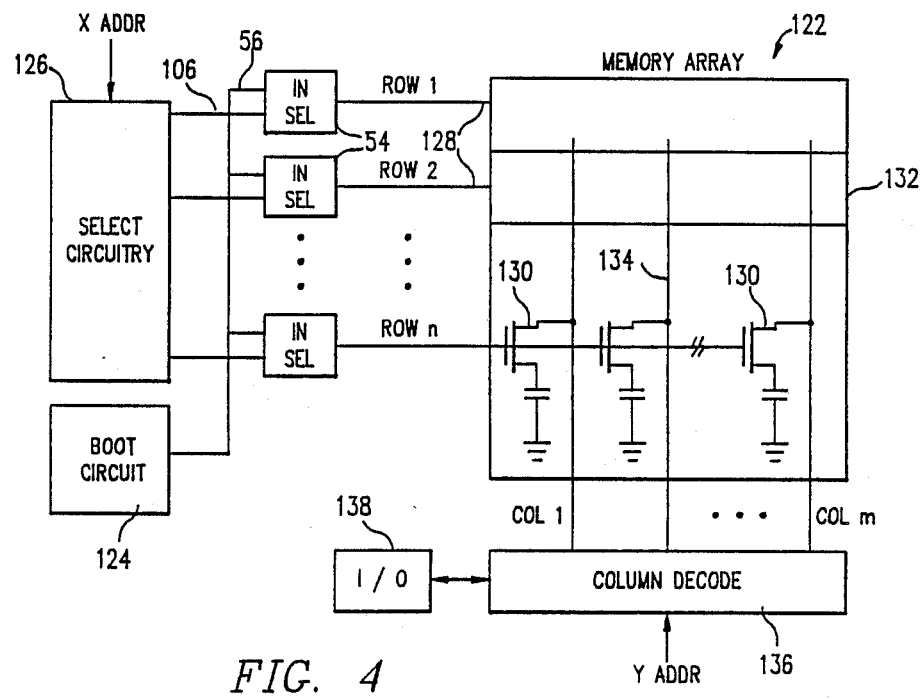
FIG. 4 illustrates the pass gate of the present invention used in an embodiment of a dynamic memory.

FIG. 4 illustrates the pass circuit of the present invention 54 as used in an embodiment of a dynamic memory 122. A plurality of pass circuits 54 of the present invention have their input nodes 56 connected to the output node of a boot circuit 124. Based on an "X" address, SELECT circuitry 126 generates a signal to one of n pass circuits 54 enabling the particular pass circuit to pass the output of the boot circuit 124 to an associated wordline 128. Each wordline 128 is connected to a row of memory cells 130 of a memory array 132. Bit lines 134 are connected to columns of the memory cells 130. A column decoder 136 connects one of m columns to an I/O circuit 138, based on a "Y" address. The construction and operation of the DRAM circuit 122 is known and described in prior patents such as U.S. Pat. No. 4,533,843.

Although a preferred embodiment of the invention has been described in detail, it should be understood that various changes, substitutions and alterations can be made therein without departing from the spirit and scope of the invention as defined by the appended claims.

What is claimed is:

1. A random access memory circuit for passing a boot signal to a wordline in response to a select signal comprising:
   a first switching device, including a first field effect transistor, for passing the boot signal to the wordline;
   a second switching device, including a second field effect transistor, for supplying a precharge signal to the gate of said first transistor in response to said select signal, the second transistor gate being precharged, prior to said select signal being received, to a first predetermined voltage level sufficient to turn said second transistor on;
   circuitry operable for generating a second predetermined voltage at the second transistor source in response to said select signal, said second predetermined voltage causing the voltage at said second transistor precharged gate to increase to a third predetermined voltage level which is greater in magnitude than said first predetermined voltage level; and
   switching circuitry operable for driving said second switching device, said switching circuitry being further operable to supply a voltage to said second transistor precharged gate such that said second transistor is nonconducting and such that the second transistor gate voltage is substantially within one second transistor threshold voltage drop of the second transistor drain voltage.

2. A method of passing a boot signal through a first transistor in response to a select signal comprising the steps of:
   applying a first predetermined voltage to the gate of a second transistor such that said second transistor is rendered conductive;
   generating a second predetermined voltage in response to the select signal, said second predetermined voltage being passed through said second transistor to the gate of the first transistor;
   the voltage of the gate of said second transistor increasing in response to said second predetermined voltage;
   discharging the gate of said second transistor to a third predetermined voltage not exceeding said second predetermined voltage by more than the threshold voltage of said second transistor such that said second transistor is put in a nonconducting state; and
   applying a boot signal to the source of the first transistor.

3. The method of claim 2 wherein said first predetermined voltage is applied to the gate of said second transistor in response to a precharge signal.

4. A random access memory circuit for passing a boot signal to a wordline in response to a select signal comprising:
   a first switching device, including a transistor comprising a first, second, and third terminal, for passing the boot signal to the wordline;
   a second switching device, including a second transistor comprising a first, second and third terminal, for supplying a precharge signal to the first terminal of said first transistor in response to the select signal, the first terminal of the second transistor being precharged, prior to the select signal being received, to a first predetermined voltage level sufficient to turn on the second transistor;
   circuitry operable for generating a second predetermined voltage at the second terminal of the second transistor in response to the select signal, the second predetermined voltage causing the voltage at the second transistor precharged first terminal to increase to a third predetermined voltage level which is greater in magnitude than said first predetermined voltage level; and
   switching circuitry operable for driving the second switching device, the switching circuitry being further operable to supply a voltage to the second transistor precharged first terminal such that the second transistor is nonconducting and such that the second transistor first terminal voltage is substantially within one second transistor threshold voltage drop of the second transistor third terminal voltage.

* * * * *